United States Patent
Gherman et al.

(10) Patent No.: US 11,374,595 B2
(45) Date of Patent: Jun. 28, 2022

(54) METHOD FOR SELECTIVELY INVERTING WORDS TO BE WRITTEN TO A MEMORY AND DEVICE FOR IMPLEMENTING SAME

(71) Applicant: COMMISSARIAT A L'ENERGIE ATOMIQUE ET AUX ENERGIES ALTERNATIVES, Paris (FR)

(72) Inventors: Valentin Gherman, Grenoble (FR); Samuel Evain, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 17/005,086

(22) Filed: Aug. 27, 2020

(65) Prior Publication Data

US 2021/0067178 A1  Mar. 4, 2021

(30) Foreign Application Priority Data

Aug. 29, 2019 (FR) ...................................... 1909492

(51) Int. Cl.
| | | |
|---|---|---|
| *H03M 13/00* | (2006.01) | |
| *H03M 13/29* | (2006.01) | |
| *G06F 11/10* | (2006.01) | |
| *G11C 11/56* | (2006.01) | |
| *G11C 16/10* | (2006.01) | |
| *G11C 16/26* | (2006.01) | |
| *G11C 13/00* | (2006.01) | |
| *G11C 16/04* | (2006.01) | |

(52) U.S. Cl.
CPC ..... *H03M 13/2942* (2013.01); *G06F 11/1068* (2013.01); *G11C 11/56* (2013.01); *G11C 16/10* (2013.01); *G11C 16/26* (2013.01); *G11C 13/0004* (2013.01); *G11C 16/0483* (2013.01)

(58) Field of Classification Search
CPC .. G06F 11/1012; G06F 11/1068; G11C 11/56; G11C 13/0004; G11C 16/10; G11C 16/26; G11C 16/0483; H03M 13/2942
See application file for complete search history.

(56) References Cited

U.S. PATENT DOCUMENTS

| | | | | |
|---|---|---|---|---|
| 6,021,085 A | * | 2/2000 | Goto | G11C 7/1006 365/230.03 |
| 10,115,444 B1 | * | 10/2018 | Shin | G06F 13/4204 |
| 2012/0166904 A1 | * | 6/2012 | Bandholz | G06F 11/1048 714/746 |

(Continued)

OTHER PUBLICATIONS

Cai, et al., "Error Analysis and Retention-aware Error Management for NAND Flash Memory", Intel Technology Journal, vol. 17, Issue 1, pp. 140-164, 2013.

(Continued)

*Primary Examiner* — Albert Decady
*Assistant Examiner* — Enamul M Kabir
(74) *Attorney, Agent, or Firm* — BakerHostetler (57) ABSTRACT

A method for selectively inverting a word to be written to a memory is provided. The memory includes memory cells, each memory cell allowing at least two values associated with at least one bit to be stored, the decision as to whether to invert a word being made depending on a number of vulnerable values, which number is determined on the basis of the data bits, of the inversion bit and of uneven check bits.

15 Claims, 8 Drawing Sheets

(56) References Cited

U.S. PATENT DOCUMENTS

| | | | |
|---|---|---|---|
| 2014/0164820 A1* | 6/2014 | Franceschini | G11C 29/028 714/6.11 |
| 2014/0266302 A1* | 9/2014 | Agrawal | H04B 1/04 326/82 |
| 2015/0212877 A1* | 7/2015 | Kern | G11C 16/06 714/764 |
| 2015/0317203 A1* | 11/2015 | Zhou | H03M 13/036 714/773 |
| 2017/0220266 A1* | 8/2017 | Ahmad | G11C 7/1006 |
| 2018/0006668 A1* | 1/2018 | Wieland | H03M 7/14 |
| 2018/0357188 A1* | 12/2018 | Brief | G06F 13/4068 |
| 2018/0358110 A1* | 12/2018 | Buyuktosunoglu | G06N 3/04 |
| 2020/0028708 A1* | 1/2020 | Wilson | H04L 12/40032 |

OTHER PUBLICATIONS

Emre, et al., "Enhancing the reliability of STT-RAM through Circuit and System Level Techniques", IEEE Workshop on Signal Processing Systems, pp. 125-130, 2012.

Yang, et al., "Improving reliability of non-volatile memory technologies through circuit level techniques and error control coding", EURASIP Journal on Advances in Signal Processing, 2012:211, 2012.

Sayed, et al., "Leveraging Systematic Unidirectional Error-Detecting Codes for fast STT-MRAM Cache", IEEE VLSI Test Symposium, pp. 1026-1032, 2017.

Kraft, et al., "Efficient Coding Scheme for DDR4 Memory Subsystems", MEMSYS, pp. 148-157, 2018.

* cited by examiner

$$H = \begin{vmatrix} 0 & 1 & 1 & 1 & 0 & 0 \\ 1 & 0 & 1 & 0 & 1 & 0 \\ 1 & 1 & 1 & 0 & 0 & 1 \end{vmatrix}$$
$$\underbrace{\phantom{xxxxxx}}_{P} \underbrace{\phantom{xxxx}}_{I_3}$$

METHOD FOR SELECTIVELY INVERTING WORDS TO BE WRITTEN TO A MEMORY AND DEVICE FOR IMPLEMENTING SAME

CROSS-REFERENCE TO RELATED APPLICATIONS

This application claims priority to foreign French patent application No. FR 1909492, filed on Aug. 29, 2019, the disclosure of which is incorporated by reference in its entirety.

FIELD OF THE INVENTION

The invention relates to the field of memories, and more particularly to a method and device for selectively inverting words during a memory write operation.

BACKGROUND

A memory is made up of a plurality of memory cells that may be single-level cells (SLCs), which contain one information bit that may take two possible electrical states, or multi-level memory cells (MLCs), which are capable of storing more than one information bit and of taking more than two electrical states. Thus, for example, MLC NAND flash memories possess memory cells that are capable of storing two information bits per cell and therefore of taking four different electrical states. Other memories allow more than two bits to be stored per cell, such as TLC NAND memories (TLC standing for triple level cell), which then allow eight electrical states, or MLC memories based on a technology enabling four bits per cell and sixteen possible electrical states.

Having a plurality of possible electrical states in the same cell decreases the margin separating the states and a proneness to errors results therefrom.

Undesirable changes of values in the memory cells may occur during write operations. These changes may occur within a cell to be programmed and/or in neighbouring cells. Specifically, since memory cells are becoming increasingly closely spaced, the perturbations caused by memory-cell write operations may affect neighbouring cells.

Figure 1:
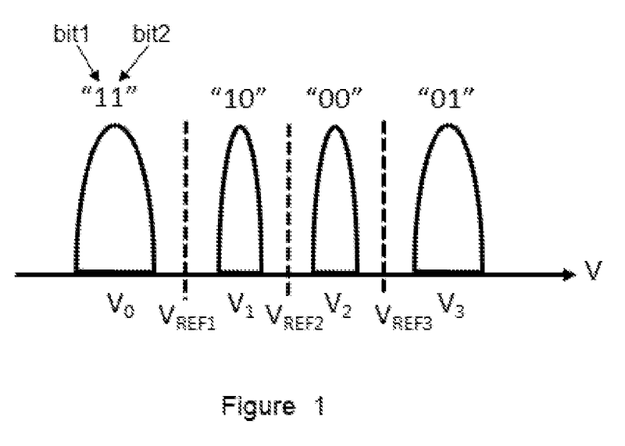
FIG. 1 an illustration of the voltage distribution in an MLC flash memory capable of storing two bits per cell.

Studies have demonstrated that the vulnerability to errors depends on the value that is to be stored, but also on the one or more values already stored in a cell or in neighbouring cells. FIG. 1 allows the proneness to errors to be illustrated for an MLC memory capable of storing two bits per cell, the bits being able to take the values '11', '10', '00' and '01' and being illustrated by the references 'bit1bit2'. In concrete embodiments, each of the two bits may belong to a different memory word. Thus, in a memory cell, an observable value V_cell may take four states corresponding to a particular combination of the two bits, where V_cell may be the threshold voltage of a flash memory cell or the electrical resistance of a PCM cell (PCM standing for phase-change memory). During complete programming of such a memory cell, the observable value V_cell takes values in four domains $V_0$, $V_1$, $V_2$, and $V_3$ corresponding respectively to the combinations '11', '10', '00' and '01' of the 'bit1bit2' pairs, as illustrated in FIG. 1.

If all the cells are considered to originally have, by default, the value 'bit1bit'=11', a write/read scenario for a multi-level cell as illustrated may be as follows. To program the first time the first bit tiff, if the value to be written is '1', there is no need for additional programming; however, if the value to be programmed is '0', it is necessary to pass from the domain $V_0$ (11) to the domain $V_2$ (00).

To then program the second bit 'bit2', it is necessary to read the value of the first bit 'bit1', in order to make it possible to determine how to pass from the current domain to the desired domain. During a memory-cell read operation, an observable value V_cell that characterizes the voltage of the cell (and that is represented by the four peaks of the domains $V_0$ to $V_3$ in FIG. 1) is measured and compared to predefined reference values between each pair of neighbouring domains, which values are illustrated by $V_{REF1}$, $V_{REF2}$, $V_{REF3}$ in FIG. 1. This comparison makes it possible to determine to which domain the measured value belongs, and thus to determine what are the values of the two bits stored in this memory cell. Thus, to read the first bit, the voltage V_cell present on the cell is compared to the reference values. If the voltage V_cell present on the cell is lower than the reference voltage $V_{REF2}$, the first bit is read as 'bit1'='1', and if the voltage V_cell present on the cell is higher than the reference voltage $V_{REF2}$, the first bit is read as 'bit1'='0'.

To program the second bit 'bit2' to '1', if the first bit tiff is read as '1', there is no need for additional programming in order to remain in the domain $V_0$ corresponding to the programmed state '11'. In contrast, if the first bit tiff is read as '0', it is necessary to pass from the domain $V_2$ corresponding to the current programmed state '00' to the domain $V_3$ corresponding to the desired programmed state '01'.

In the same way, to program the second bit 'bit2' to '0', if the first bit 'bit1' is read as '1', it is necessary to pass from the domain $V_0$ corresponding to the current programmed state '11' to the domain $V_1$ corresponding to the desired programmed state '10'. In contrast, if the first 'bit1' tiff is read as '0', there is no need for additional programming to remain in the domain $V_2$ corresponding to the desired programmed state '0 '.

Similarly, during an operation of reading the second bit 'bit2', the voltage V_cell present on the cell is measured and compared to the reference values in order to deduce therefrom the value of the second bit.

The study by Y. Cai et al. "Error Analysis and Retention-aware Error Management for NAND Flash Memory," Intel Technology Journal, Volume 17, Issue 1, pp. 140-164, 2013, has demonstrated that, in the case of MLC NAND flash memories with 2 bits per cell, the combination of bits '00' and '01' corresponding to the highest threshold voltages (domains $V_2$ and $V_3$ in FIG. 1) are the most vulnerable to errors, and that it is the first bit of these combinations that is the most vulnerable as equal to '0'. The skilled person may refer to this article in its entirety to read details of the study. In the case of such a memory, it is understandable to attempt to avoid as much as possible programming the combination '01' to the memory cells. The value '0' is then considered to be a vulnerable value for the first bit and the value '1' is considered to be a vulnerable value for the second bit. However, the skilled person will understand that this is an example and that another convention could be used to define the combinations of bits per domain, such as, for example, a convention respectively assigning the domain $V_0$ to '11', the domain $V_1$ to '10', the domain $V_2$ to '00' and the domain $V_3$ to '01', as illustrated in FIG. 1. The demonstrated principle, namely that the vulnerability to errors depends on the value that is to be stored and on the one or more values already stored in a cell or in neighbouring cells, remains true.

Thus, it is to be noted that a large majority of memories are asymmetric with respect to vulnerability to errors. In the case of binary memories, either the bits '0' or the bits '1' may be the most vulnerable. In the case of a dynamic random-access memory (DRAM), the bits '1' are, in general, more vulnerable than the bits '0', and there may be up to four decades of difference between the vulnerabilities of the two values, as is explained by K. Kraft et al. in "Efficient Coding Scheme for DDR4 Memory Subsystems," MEMSYS, pp. 148-157, 2018.

In the case of spin-transfer torque magnetoresistive random-access memory (STT-MRAM), the '1' are more vulnerable to errors than the '0' and there may be up to three decades of difference between the error rates affecting the two values. This is detailed by Y. Emre et al. in "Enhancing the reliability of STT-RAM through Circuit and System Level Techniques," IEEE Workshop on Signal Processing Systems, pp. 125-130, 2012, and by C. Yang et al. in "Improving reliability of non-volatile memory technologies through circuit level techniques and error control coding," EURASIP Journal on Advances in Signal Processing, 2012: 211, 2012.

When the difference between the error rates affecting the different values stored in a memory is a number of decades, the memory is commonly considered to be affected only by unidirectional errors and it is possible to use error detection codes allowing all the unidirectional errors in a memory word to be detected. However, as these codes merely detect errors but do not allow errors to be corrected, such an approach is applicable only in the case of cache memories the stored data of which possess a replica stored elsewhere. The document by de N. Sayed, F. Oboril, R. Bishnoi and M. B. Tahoori, "Leveraging Systematic Unidirectional Error-Detecting Codes for fast STT-MRAM Cache," IEEE VLSI Test Symposium, pp. 1026-1032, 2017, describes this approach.

A commonplace way of improving the performance of memories (SRAMs, cache memories, DRAMs, flash memories, etc.) is to decrease their error rate. To decrease error rate, one solution consists in inverting the words to be written to memory before their storage if they contain too great a number of vulnerable values. It is necessary to add one additional bit per memory word in order to indicate the inversion state of the word. This solution is referred to here as "selective memory word inversion" (SMWI) and the bit added to indicate the inversion state of a memory word is called the "inversion bit".

The SMWI technique may be combined with use of an error-correcting code (ECC, enabling the detection and correction of errors) that encodes the data before they are written to memory. During the encoding of data with an ECC, check bits are added to the data bits, the check bits representing redundant information computed from the data bits and that allows errors affecting not only the data bits but also the check bits to be detected and corrected. The data bits and check bits together form a code word. In the case where an inversion bit is added to the data bits, this bit is treated as an additional data bit during the encoding and decoding of the ECC, and forms part of the code word. Although for DDR4 memories it has been reported in the literature that significant decreases in numbers of errors have been obtained using the SMWI technique combined with an ECC (see the previously cited article K. Kraft et al. "Efficient Coding Scheme for DDR4 Memory Subsystems," MEMSYS, pp. 148-157, 2018), the decision to invert a code word before it is written to memory is clearly made solely depending on the number of vulnerable values among the data bits, and does not take into account all of the potentially vulnerable values of a code word containing the data bits, inversion bit and check bits.

SUMMARY OF THE INVENTION

Thus, one object of the invention is to mitigate the drawbacks of known techniques with a view to decreasing memory error rates.

To this end, the invention provides a solution that aims to improve memory reliability by implementing a selective code-word inversion operation, the decision to invert a word being made depending on a number of vulnerable values, which number is determined on the basis of the data bits, of the inversion bit and of certain check bits.

To achieve the sought aim, a method is provided for selectively inverting a word to be written to a memory, the memory comprising memory cells, each memory cell allowing at least two values associated with at least one bit to be stored. The method for selectively inverting comprises at least the following steps: associating an inversion bit with a plurality k of data bits of a data word to be written to the memory, the inversion bit having a predefined value indicating a non-inversion state of the k data bits;

computing, with an error-correcting code, on the basis of the k data bits and of the inversion bit, a number r of check bits, the r check bits comprising s even check bits and r-s uneven check bits, and being such that the k data bits, the inversion bit and the r even and uneven check bits together form a code word v1 of k+1+r bits to be stored in the memory;

defining, if not predefined, among the memory cells intended to store the code word, a number y of cells that are said to be sensitive, the values of the bits stored in these cells being liable to correspond to vulnerable values;

determining, among the bits of said code word v1 that are intended to be stored in said y sensitive cells:

a number n1 of bits of interest having a vulnerable value and for which an operation of inverting said code word would lead to the obtainment of a non-vulnerable value; and/or a number n2 corresponding, in said code word and among the bits intended to be stored in said y sensitive cells, to the number of bits for which an operation of inverting the code word would lead to the obtainment of a vulnerable value;

evaluating the numbers n1 and/or n2 with a view to deciding whether or not to invert the code word; and if it is decided to carry out the inverting operation, inverting, in the code word: the k data bits, the inversion bit and the r-s uneven check bits in order to obtain a new code word v2.

According to alternative or combinable embodiments:

the step of evaluating the numbers n1 and/or n2 consists in comparing the obtained number n1 of bits of interest to a predefined number z, said predefined number z characterizing a threshold beyond which said code word contains, after an inverting operation, more bits having a vulnerable value than the code word before inversion. the step of determining the number n1 of bits of interest consists in searching for vulnerable values solely among the k data bits, the inversion bit and the r-s uneven check bits and the number z is predefined taking into account the number of sensitive memory cells capable of storing one of the k data bits, the inversion bit or one of the r-s uneven check bits.

the memory cells are each intended to store 1 bit able to take two "0" or "1" values, and one of the values is more vulnerable than the other because it has a higher probability of changing and becoming the other of the two values.

the number y of sensitive cells is predefined and for example corresponds to the set of cells intended to store the code word.

each memory cell is capable of storing a plurality of bits each capable of taking two values coding at least four possible states of the memory cell, each memory cell is capable of storing at least two bits belonging to at least two different code words, and each cell has at least one vulnerable state coded by corresponding values of said at least two bits, these corresponding values being referred to as vulnerable values; and the step of defining the y sensitive cells consists in taking into account the values taken by the bits of the other code words already stored in the memory cells intended to store the code word to be written.

the step of defining the y sensitive cells comprises the following steps:

reading the other code words already stored in the memory cells intended to store said code word to be written;

defining, for each bit of the other already stored code words, whether the associated value corresponds to a predefined vulnerable value and, if such is the case, defining the cell in question to be a sensitive cell.

the method in addition comprises a step of writing to memory either the non-inverted code word v1 or said new code word v2.

the method in addition comprises a step of reading a code word stored in the memory according to the steps of the claimed method for selectively inverting.

The invention also covers a device for selectively inverting a word to be written to a memory, the memory comprising memory cells, each memory cell allowing at least two values associated with at least one bit to be stored, the device comprising means allowing the steps of the claimed method for selectively inverting to be implemented.

According to alternative or combinable embodiments:

the device in addition comprises means for reading a word stored in the memory and for determining whether the stored word is inverted or not. the memory consists of a plurality of single-level memory cells containing a single information bit that may take two possible electrical states, or consists of a plurality of multi-level memory cells capable of storing more than one information bit and of taking more than two electrical states.

the claimed means comprise an error-correcting code that has one or more of the features of being linear, binary, of block and/or systematic type.

Another subject of the invention is a computer program containing code instructions for executing the steps of the claimed method for selectively inverting, when said program is executed by a processor.

BRIEF DESCRIPTION OF THE DRAWINGS

Other features, details and advantages of the invention will become more clearly apparent on reading the description given with reference to the appended drawings, which are given by way of example and respectively show.

DETAILED DESCRIPTION

Figure 2:
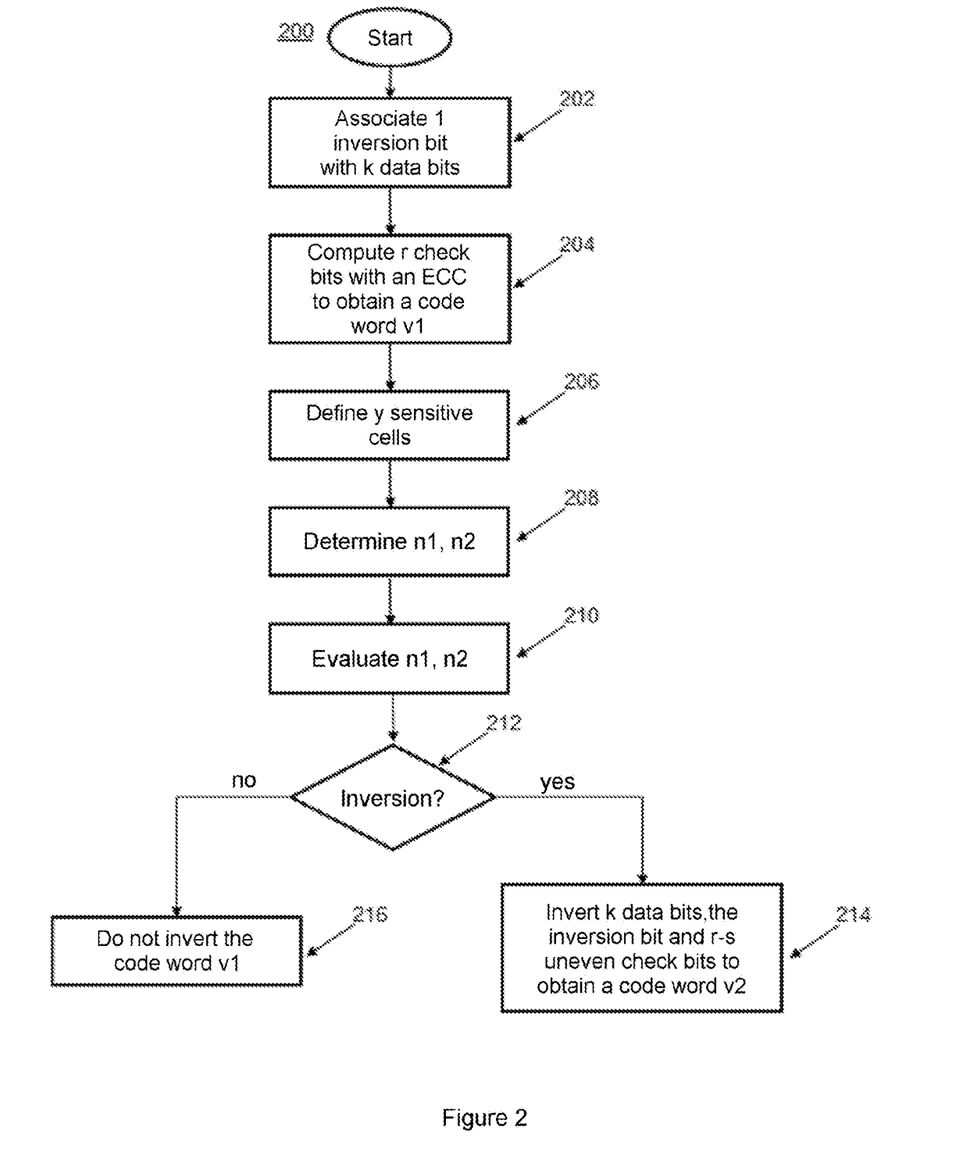
FIG. 2 the steps of a method for selectively inverting according to one embodiment of the invention.

FIG. 2 shows one example of a method 200 for selectively inverting according to the invention. The general method that is described applies to various types of memories, whether they be memories with SLC, MLC or TLC cells. Thus, the memory may comprise a plurality of memory cells in which each memory cell allows at least two values associated with at least one bit to be stored.

The method 200 uses as input k data bits composing a memory word that must be written to a defined address of the memory. In a first step 202, the method allows an inversion bit to be associated with k data bits of the memory word. A predefined value is attributed to the inversion bit in order to characterize the initial non-inversion state of the memory word.

In a following step 204, the method allows, with an ECC, a number r of check bits to be computed on the basis of the k data bits and of the inversion bit, in order to obtain a code word v1. With respect to the operation whereby the code word is encoded by the ECC, the inversion bit is treated just like all the k other data bits.

Figure 3:
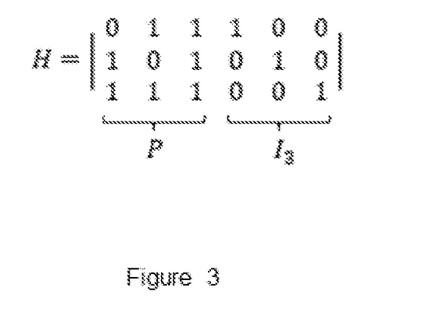
FIG. 3 an illustration of a parity matrix H for an ECC with 3 data bits.

It will be recalled that the code words of a systematic linear correcting code are defined using a parity matrix $H=[P, I_r]$ composed of a sub-matrix P, in which each column corresponds to the data bits, and of an identity sub-matrix in which each column corresponds to the check bits. FIG. 3 illustrates a parity matrix H for an error-correcting code with 3 data bits (k=3) and 3 check bits (r=3). The first 3 columns correspond to the sub-matrix P and the last 3 columns to the sub-matrix $I_r$ for r equal to 3.

A vector v is a code word only if its product with the matrix H generates a zero vector, such that H. v=0. In the case of a systematic ECC, each code word v is divided into a vector d of data bits and a vector c of check bits and may be written:

$$v = \begin{pmatrix} d \\ c \end{pmatrix}.$$

It is therefore possible to make the distinction between the data bits and the check bits, for example using the notation:

$$v = \begin{pmatrix} d1 \\ d2 \\ d3 \\ c1 \\ c2 \\ c3 \end{pmatrix}.$$

The matrix P may be used to compute the vector c of check bits. In the example of the matrix of FIG. 3, the check bits c1 and c2 are even, and the bit c3 is an uneven check bit. The parameter s may be defined as corresponding to the number of even check bits and the parameter r-s as corresponding to the number of uneven check bits. In the case of FIG. 3, the parameter s is equal to 2 and the parameter r-s is equal to 1.

An error-correcting code is binary if the code words contain only binary values.

An error-correcting code is a code of block type if the code words have a set number of bits.

During the read of the data present in a memory, each code word v is checked by evaluating the matrix product H.v. The result of this operation is a vector that is also called the syndrome. If the syndrome is a zero vector, the code word is considered to be correct. A non-zero syndrome indicates the presence of at least one error. If the syndrome allows the positions of the affected bits to be identified, the code word may be corrected.

Various linear ECCs with different error-detecting and -correcting capacities may be employed. By way of example, Hamming codes allow a single error, i.e. an error that affects a single bit, to be corrected. This correction capacity is qualified SEC, SEC standing for single error correction.

DEC codes, DEC standing for double error correction, are another example of a type of ECC code. A DEC code allows double errors, i.e. errors affecting two bits in a code word, to be corrected.

Returning to step 204, the r check bits of an ECC of block type, which is furthermore linear, systematic and binary, may be categorized into s even check bits and r-s uneven check bits, such that the k data bits, the inversion bit and the r even and uneven check bits together form a code word v1 of k+1+r bits to be stored in the memory. The skilled person knows that one definition of the even and uneven check bits is that a check bit is called uneven if its value inverts when all the data bits are inverted, and that, in the contrary case, the check bit is called even.

In a following step 206, the method allows, among the memory cells intended to store the code word v1, if it has not been predefined, a number y of memory cells that are considered to be sensitive to be defined. The sensitive cells are those for which the values of the bits stored in these cells are liable to correspond to vulnerable values, according to the chosen convention.

In a following step 208, the method allows one or two numbers n1 and/or n2 of bits for which an operation of inverting the code word v1 would lead to the obtainment of non-vulnerable values or vulnerable values, respectively, to be determined.

In one embodiment, the number n1 is computed on the basis of the bits of the code word v1 that are intended to be stored in the y sensitive cells, and consists in determining n1 bits of interest having a vulnerable value, for which bits an operation of inverting the code word v1 would lead to the obtainment of a non-vulnerable value.

In one embodiment, the number n2 is computed on the basis of the bits of the code word v1 that are intended to be stored in the y sensitive cells, and consists in determining n2 bits (having a vulnerable or non-vulnerable value) for which an operation of inverting the code word v1 would lead to the obtainment of a vulnerable value, which is undesirable.

In a following step 210, the method allows the obtained values of one n1 or of each of the two numbers n1 and n2 to be evaluated.

In one embodiment, the step of evaluating the numbers n1 and/or n2 consists in comparing the obtained number n1 of bits of interest to a predefined number z characterizing a threshold beyond which a code word of k+1+r bits contains, after an inverting operation, more bits having a vulnerable value than the code word before inversion.

In one embodiment, the number n1 of bits of interest is determined by searching for vulnerable values solely among the k data bits, the inversion bit and the r-s uneven check bits, with the number z predefined.

In one embodiment, the number y of sensitive cells is predefined and corresponds to the set of cells intended to store the code word.

The research of the inventors has allowed them to observe that the result of an operation of inverting a code word using an SMWI approach depends on the presence and on the number of even check bits and of uneven check bits, but that only the values taken by the uneven check bits have an effect on the number of vulnerable values after inversion. Thus, the number of vulnerable values taken by the even check bits does not need to be taken into account in the step 208 of determining the numbers n1 and/or n2.

Advantageously, as only the number of uneven check bits are counted in the process of determining whether or not to carry out an inversion, the method of the invention decreases the number of bits for which it is necessary to determine whether the value is vulnerable, this allowing the time taken to execute this operation to be decreased, and thus the latency of a memory write operation to be decreased.

Another advantage of the method of the invention resides in the fact that knowledge of the number of even check bits allows the threshold used for the predefined number z, i.e. to decide whether a code word must be inverted before it is written to memory, to be precisely adjusted. Advantageously, this also allows the error rate that affects the memory, the complexity of the method and the size of the device used to perform a memory write operation to be decreased.

The result of the evaluating step 210 consists in determining 212 whether the code word must be inverted or not. If inversion is required, the method passes to the following step 214 in order to invert, in the code word, the k data bits, the inversion bit and the r-s uneven check bits and to obtain a new code word v2.

If the inversion is not required, the method keeps the initial code word v1, which is not inverted 216.

In a subsequent step, the method allows either the non-inverted code word v1 or the inverted code word v2 to be written to memory at the predefined address.

Figure 4:
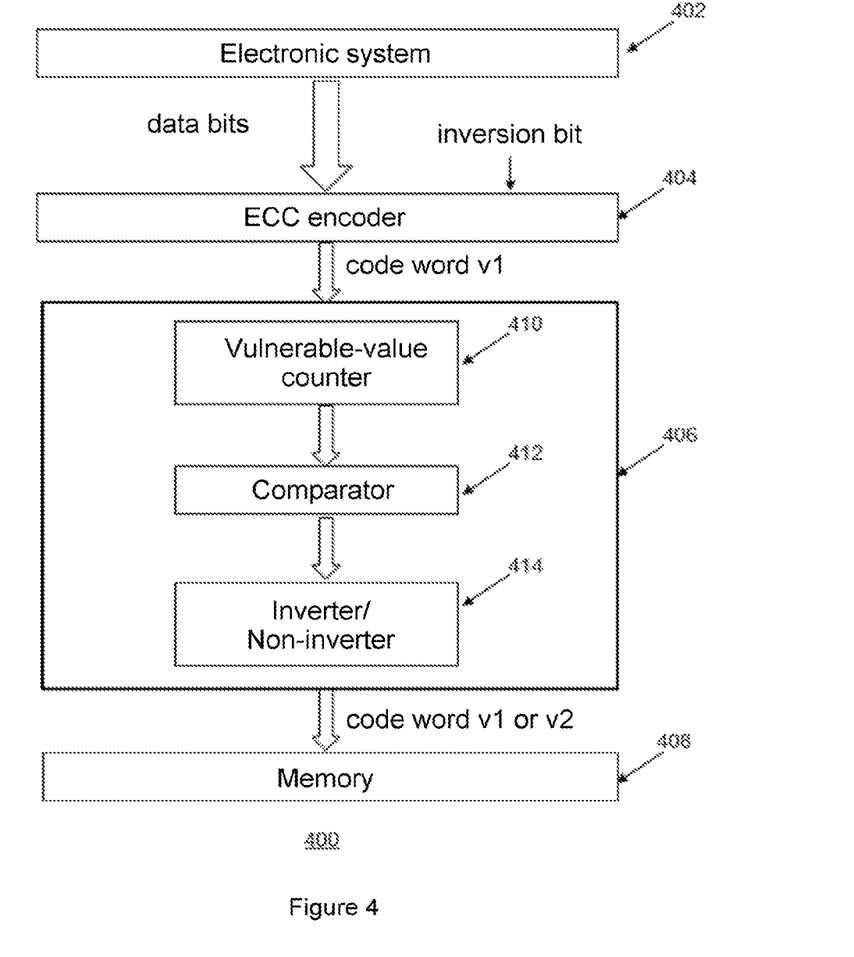
FIG. 4 one embodiment of a device allowing the steps of the method for selectively inverting of the invention to be implemented.

FIG. 4 shows an exemplary embodiment of a device 400 allowing the steps of the method 200 for selectively inverting of the invention to be implemented. The device may be used to perform a transfer of data from an electronic system 402 to a memory 408 in which the data bits are stored after application of the inverting method. The data to be written are delivered by an electronic system 402, which may be a circuit based on a processor, multiprocessor, FPGA (acronym of field-programmable gate array) or ASIC (acronym of application-specific integrated circuit). In one embodiment, the electronic system 402 may be a memory controller implemented in a storage system. In one embodiment, the electronic system delivers the k data bits and the inversion bit indicating the non-inversion state of the initial memory word is added. Alternatively, the data delivered by the electronic system contain the k data bits and the inversion bit together. The device comprises an ECC 404 able to receive data from the electronic system, to encode the data by computing check bits on the basis of the data bits and of the inversion bit, and to generate a code word v1 comprising the k data bits, 1 inversion bit and r check bits including s even check bits and r-s uneven check bits. According to various embodiments of the invention, the ECC has all or some of the following features:

the code is linear;
the code is binary;

the code is a code of block type;
the code is systematic.

The device 400 in addition comprises an inversion-determining module 406, which is composed of a counter 410 of vulnerable values, of a comparator 412 and of an inverting module 414. The inversion-determining module 406 is configured to carry out the steps of FIG. 2, and in particular steps 206 and 208 with the comparator 410, step 210 with the comparator 412 and steps 212 to 216 with the inverting module 414.

The device 400 has been simplified in order to illustrate only the functional modules required to carry out the inverting method of the invention and is non-limiting. Thus, variant embodiments may be employed with respect to implementation of the various modules. Thus, for example, the error-correcting code 404 may be an external module or be integrated into the memory 408.

In one embodiment, the memory 408 is organized into a plurality of memory cells, each memory cell allowing 1 bit able to take two values, "0" and "1", to be stored, one of the values being more vulnerable than the other because it has a higher probability of changing and becoming the other of the two values.

Figure 5:
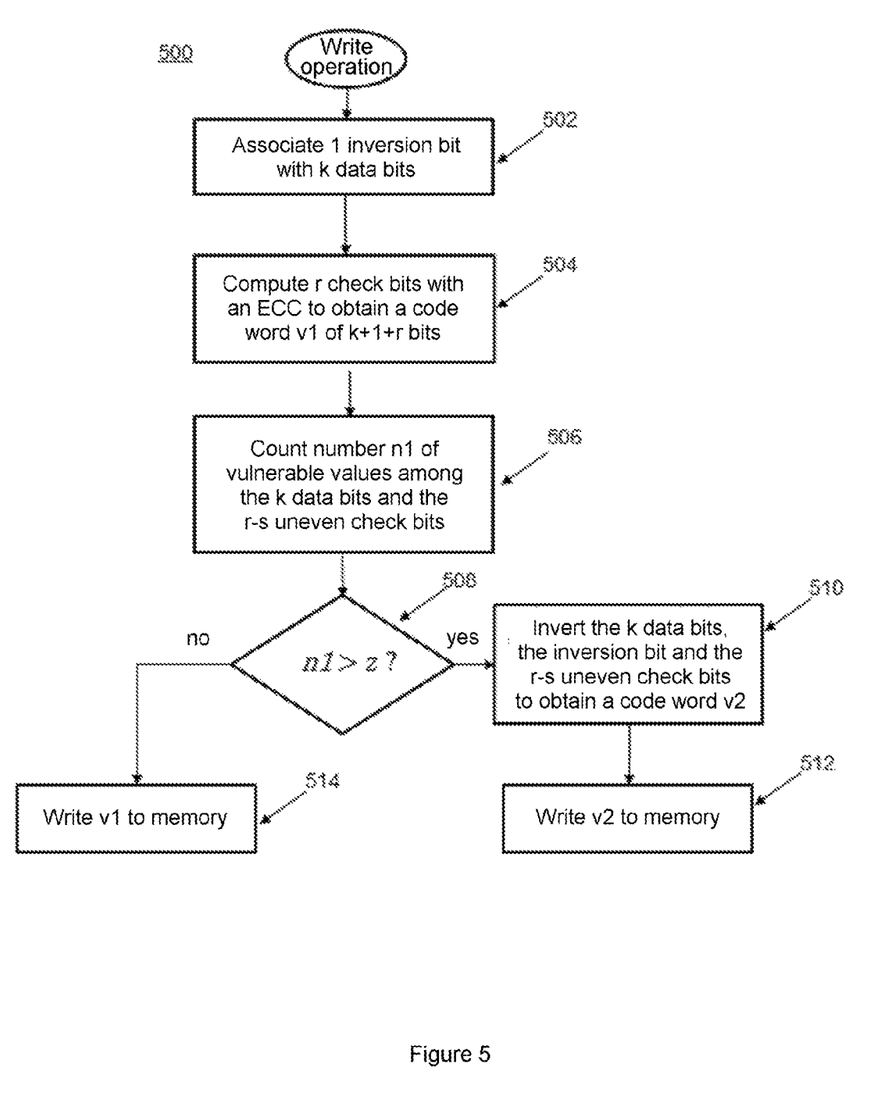
FIG. 5 the steps of one method for writing a word to a memory according to one embodiment of the method for selectively inverting of the invention.

FIG. 5 illustrates the steps of a method for writing a word to such a memory according to one embodiment of the method 300 for selectively inverting of the invention.

The method 500 starts with steps 502 and 504, which are identical to steps 202 and 204 of the method of FIG. 2, respectively: in step 502 the method allows an inversion bit to be associated with a predefined value characterizing the initial non-inversion state of the memory word, and, in the following step 504, the method allows a number r of check bits with s even check bits and r-s uneven check bits to be computed on the basis of the k data bits and of the inversion bit, in order to obtain a code word v1 of k+1+r bits. In this embodiment, all the memory cells to which a code word must be written are considered to be sensitive cells.

The following step 506 consists in counting the number n1 of vulnerable values among the k data bits and the r-s uneven check bits.

In the following step 508, the method allows the obtained number n1 to be compared to a number z characterizing a threshold beyond which a code word of k+1+r bits contains, after an inverting operation, more bits having a vulnerable value than the code word before inversion.

In the case where a vulnerable value is not assigned to the inversion bit, the comparison threshold is $$z = \frac{k+1+r-s}{2}. \quad (1)$$

In the case where a vulnerable value is assigned to the inversion bit, the comparison threshold is $$z = \frac{k-1+r-s}{2}. \quad (1')$$

If the result of the comparison is that n1 is higher than the threshold (1) or (1'), meaning that the number of vulnerable values without inversion is higher than the reference threshold, the method continues, in step 510, with inversion, in the code word v1, of the k data bits, of the inversion bit and of the r-s uneven check bits in order to generate a new code word v2. The values of the s even check bits are not changed in order to obtain a code word after the inversion process.

Following the inversion of the mentioned bits, the number n' of vulnerable values among the data bits, the inversion bit and the uneven check bits is then defined by the following expression: n'=k+1+r−s−n1 (2). By combining the expression (2) with the expression $$n1 > \frac{k+1+r-s}{2},$$

the following expression is obtained:

$$n' < \frac{k+1+r-s}{2}, \quad (3)$$

which means that n'<n1 and therefore that the code word v2 obtained after inversion contains fewer vulnerable values than the initial code word v1 before inversion.

The method ends with a step 512 of writing the code word v2 to the defined memory location.

Returning to the comparing step 508, if the obtained number n1 is lower than the threshold z defined by (1) or (1'), meaning that the code word v1 does not need to be inverted, the method ends with a step 514 of writing the code word v1 to the defined memory location.

Advantageously, the method of FIG. 5 may be implemented using the device 400 described with reference to FIG. 4, to program, at a specified address, in multi-level memory cells, a first word.

In one variant embodiment, the memory 408 is organized into a plurality of memory cells, each memory cell allowing a plurality of bits to be stored each capable of taking two values coding at least four possible states of the memory cell, each memory cell being capable of storing at least two bits belonging to at least two different code words, and each cell having at least one vulnerable state coded by corresponding values of said at least two bits, these corresponding values being referred to as vulnerable values. In this memory configuration, the method of the invention may be carried out to program a word in memory cells that already contain a code word.

Figure 6:
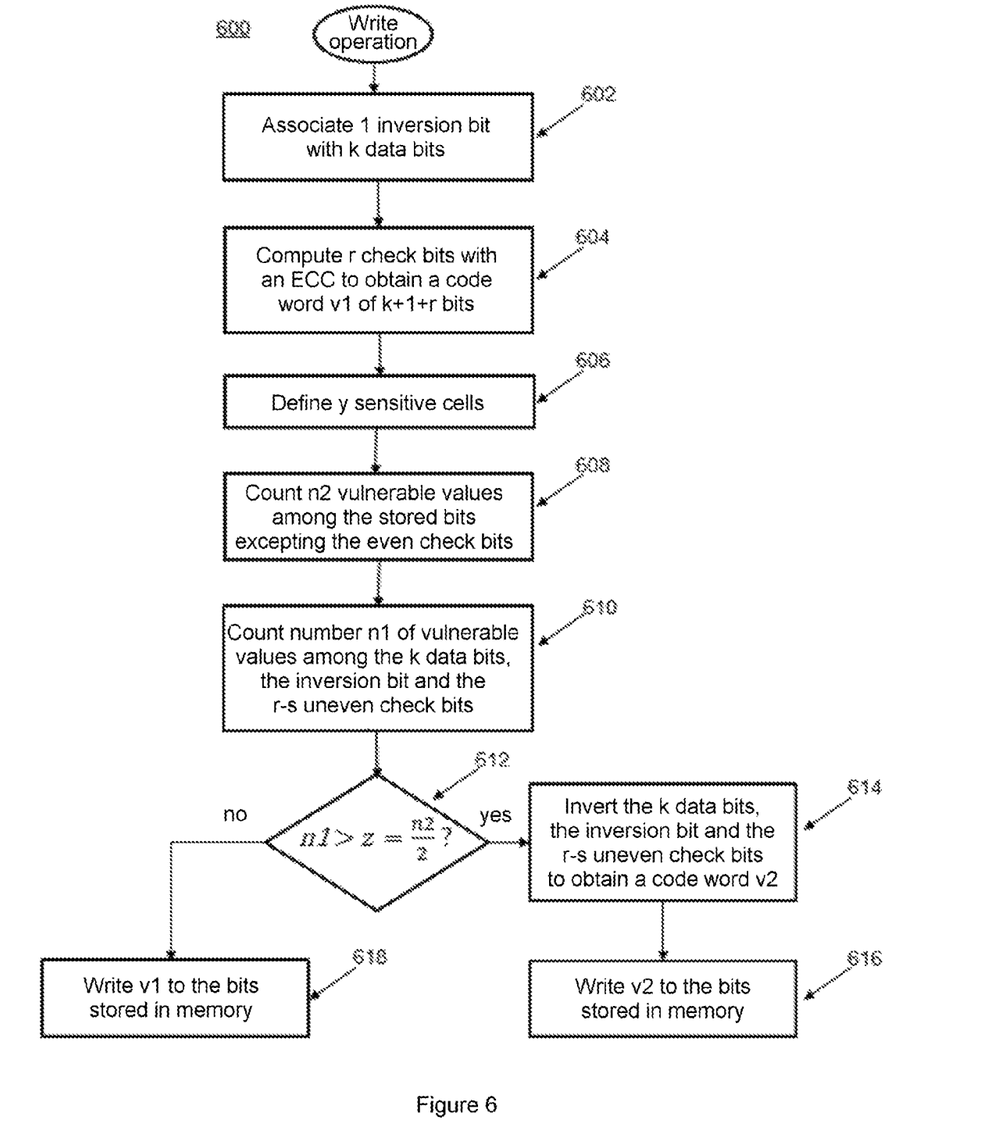
FIG. 6 the steps of another method for writing a word to a memory according to one embodiment of the method for selectively inverting of the invention.

FIG. 6 illustrates steps according to one embodiment of the method for selectively inverting of the invention, for writing a word to memory cells that already contain at least one stored code word and that allow at least one additional code word to be stored.

The method 600 starts with steps 602 and 604 that are identical to steps 202 and 204 of the method of FIG. 2, respectively: in step 602 the method allows k data bits of a new memory word and an inversion bit to be associated with a predefined value characterizing the initial non-inversion state of the memory word to be written, and in the following step 604 the method allows, on the basis of the k data bits and of the inversion bit, a number r of check bits with s even check bits and r-s uneven check bits to be computed, in order to obtain a code word v1 of k+1+r bits.

The method continues, in step 606, to define a number y of sensitive cells while taking into account the values taken by the bits of the one or more code words already stored in the memory cells intended to store the code word to be written. The y sensitive cells are identified by reading the one or more code words already stored in the memory cells intended to store the code word to be written, and defining, for each bit of the already stored other code words, whether the values associated with the already stored bits are vulnerable, and, if such is the case, defining the cell in question to be a sensitive cell.

In the following step 608, the method allows the number n2 of vulnerable values among the already stored bits with the exception of the even check bits to be counted, then, in the following step 610, the method allows, among the k data bits, the inversion bit and the r-s uneven check bits of the word to be written, the number n1 of vulnerable values that must be stored in a sensitive cell to be counted.

In a following step 612, the method allows the number n1 to be compared to a threshold z that is set to half the value of the number n2 computed beforehand. If the result of the comparison is that n1 is higher than $$\frac{n2}{2},$$

the method continues, in step 614, to invert, in the word to be written, the k data bits, the inversion bit and the r-s uneven check bits, and to obtain a code word v2.

The method ends with a step 614 of writing the code word v2 to the memory location where a word is already stored.

If the result of the comparison is that n1 is lower than $$\frac{n2}{2},$$

meaning that the code word does not need to be inverted, the method ends with the step 618 of writing the code word v1 to the memory location where a word is already stored.

In one embodiment, the method 600 may be carried out using the device 400 described with reference to FIG. 4.

Figure 7:
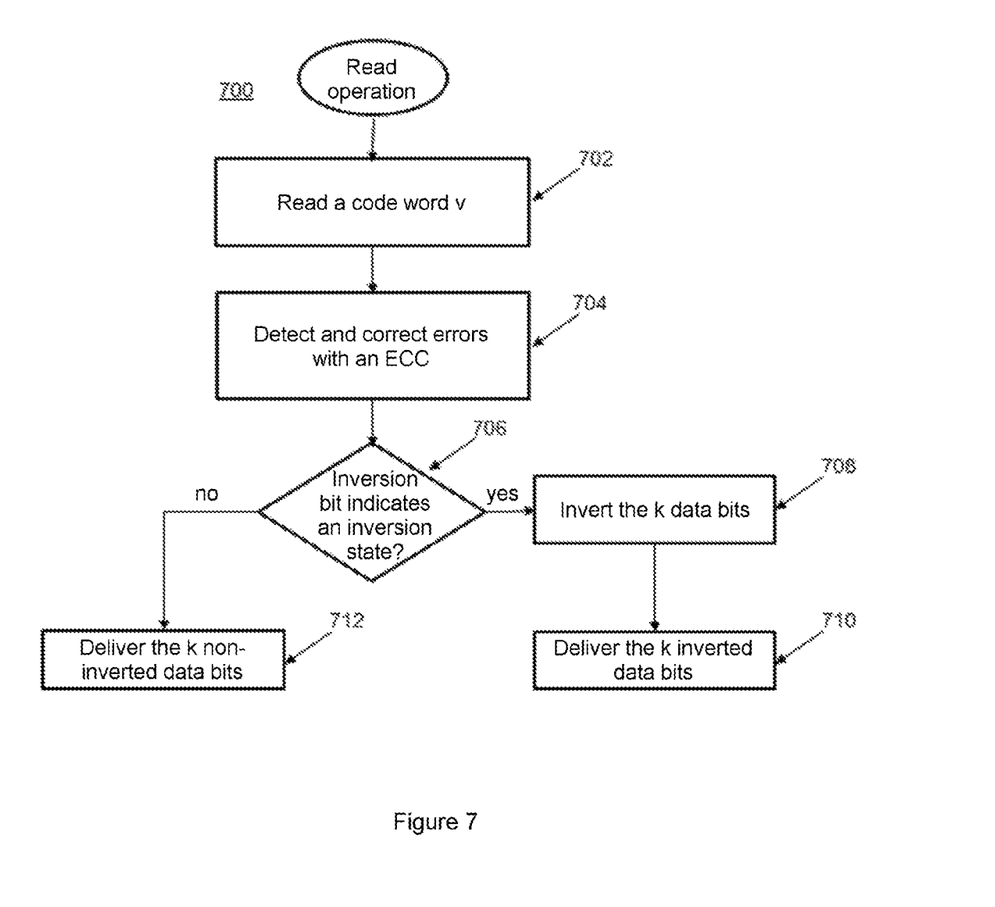
FIG. 7 the steps of a method for reading a word of a memory according to one embodiment of the invention.
Figure 8:
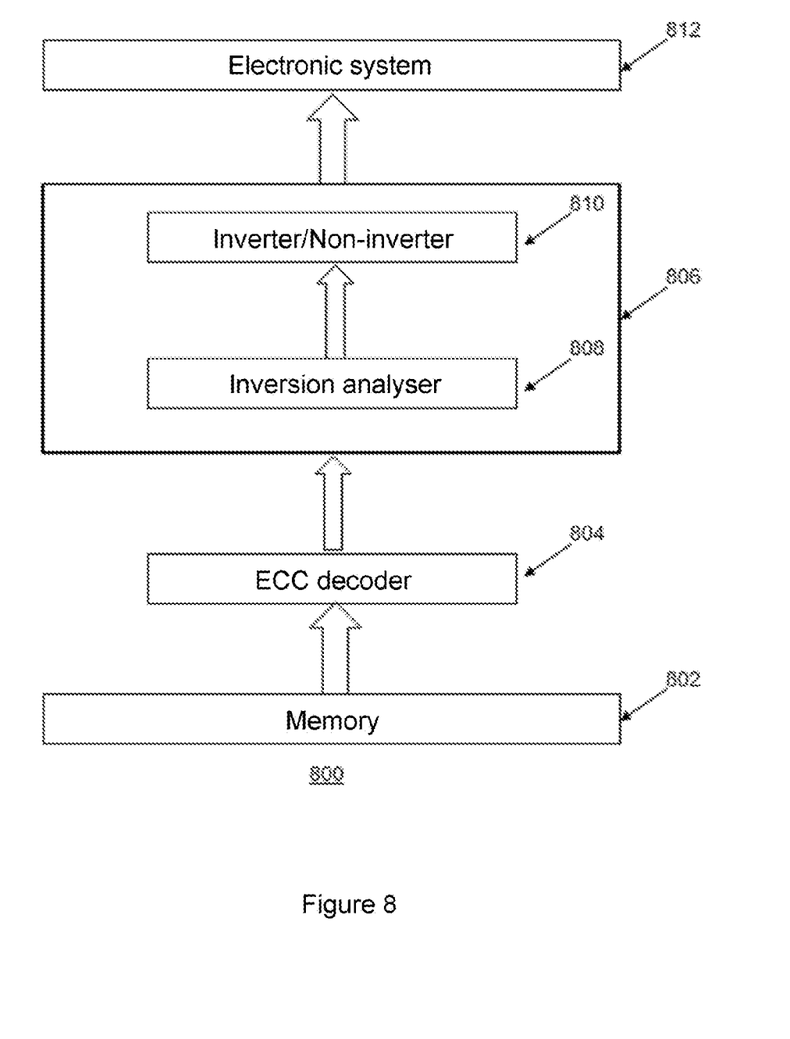
FIG. 8 one embodiment of a device allowing the steps of the reading method of the invention to be carried out.

FIG. 7 shows a sequence of steps of a method 700 for reading a word stored in memory according to the principles of the invention, and FIG. 8 shows one embodiment of a device allowing the steps of the reading method of FIG. 7 to be carried out. The method starts with reception 702 of a request to read a code word v stored at a memory address. The code word contains a plurality k of data bits, an inversion bit and even and uneven check bits that are stored in a memory 802 after the execution of one of the methods 200, 500 or 600 described above. The method allows an error-correcting code 804 to detect errors and, where appropriate, them to be corrected 704. Next, the method allows, by means of an inversion-analysing module 808, the value of the inversion bit 706 to be checked in order to determine whether the code word has been stored after inversion or not. If the value of the inversion bit indicates that an inversion took place for storage of the code word, the method allows, by means of an inverting circuit 810, all the data bits of the code word to be inverted 708 and the initial data bits 710 to be delivered to an electronic system 812. If the value of the inversion bit indicates that there was no inversion for the storage of the code word, the method allows the stored data bits to be delivered 712 directly to the electronic system without inverting them.

In one embodiment, the code word that is inverted 708 may be reprogrammed in memory either at the initial address, or at another address.

The present description illustrates one implementation of the invention, which implementation is preferred but non-limiting. Examples have been given in order to allow a good comprehension of the principles of the invention and a concrete application, but they are in no way exhaustive and the skilled person will be able to make modifications and apply variants of implementation thereto while keeping to said principles. Thus, for example, the various described methods may be implemented within one and the same device.

The invention may be implemented using hardware and/or software elements. It may be made available in the form of a computer-program product that is executed by a dedicated processor or by a memory controller of a storage system, and that contains code instructions for executing the steps of the methods in their various embodiments. In variant embodiments, each functional encoding, counting, comparing and inverting module may be implemented by a dedicated module such as an ASIC.

The invention claimed is:

1. A method for selectively inverting a word to be written to a memory, the memory comprising memory cells, each memory cell allowing at least two values associated with at least one bit to be stored, the method for selectively inverting comprising at least the following steps:

associating an inversion bit with a plurality k of data bits of a data word to be written to the memory, the inversion bit having a predefined value indicating a non-inversion state of the k data bits;

computing, with an error-correcting code, on the basis of the k data bits and of the inversion bit, a number r of check bits, the r check bits comprising seven check bits and r-s odd check bits, and being such that the k data bits, the inversion bit and the r even and odd check bits together form a code word v1 of k+1+r bits to be stored in the memory;

defining, if not predefined, among the memory cells intended to store the code word, a number y of cells that are said to be sensitive, the values of the bits stored in these cells being liable to correspond to vulnerable values;

determining, among the bits of said code word vl that are intended to be stored in said y sensitive cells:
a number n1 of bits of interest having a vulnerable value and for which an operation of inverting said code word would lead to the obtainment of a non-vulnerable value; and/or
a number n2 corresponding, in said code word and among the bits intended to be stored in said y sensitive cells, to the number of bits for which an operation of inverting the code word would lead to the obtainment of a vulnerable value;

evaluating the numbers n1 and/or n2 with a view to deciding whether or not to invert the code word; and if it is decided to carry out the inverting operation, inverting, in the code word: the k data bits, the inversion bit and the r-s odd check bits in order to obtain a new code word v2.

2. The method according to claim 1, wherein the step of evaluating the numbers n1 and/or n2 consists in comparing the obtained number n1 of bits of interest to a predefined number z, the predefined number z characterizing a threshold beyond which said code word contains, after an inverting operation, more bits having a vulnerable value than the code word before inversion.

3. The method according to claim 2, wherein the step of determining the number n1 of bits of interest consists in searching for vulnerable values solely among the k data bits, the inversion bit and the r-s odd check bits and wherein the number z is predefined taking into account the number of sensitive memory cells capable of storing one of the k data bits, the inversion bit or one of the r-s odd check bits.

4. The method according to claim 1, wherein the memory cells are each intended to store 1 bit able to take two "0" or "1" values, and wherein one of the values is more vulnerable than the other because it has a higher probability of changing and becoming the other of the two values.

5. The method according to claim 1, wherein the number y of sensitive cells is predefined and for example corresponds to the set of cells intended to store the code word.

6. The method according to claim 5, wherein said step of defining they sensitive cells comprises the following steps:
   reading the other code words already stored in the memory cells intended to store said code word to be written;
   defining, for each bit of the other already stored code words, whether the associated value corresponds to a predefined vulnerable value and, if such is the case, defining the cell in question to be a sensitive cell.

7. The method according to claim 1, wherein each memory cell is capable of storing a plurality of bits each capable of taking two values coding at least four possible states of the memory cell, and wherein each memory cell is capable of storing at least two bits belonging to at least two different code words, and wherein each cell has at least one vulnerable state coded by corresponding values of said at least two bits, these corresponding values being referred to as vulnerable values; and wherein the step of defining the y sensitive cells consists in taking into account the values taken by the bits of the other code words already stored in the memory cells intended to store the code word to be written.

8. The method according to claim 1, further comprising a step of writing to memory either the non-inverted code word v1 or said new code word v2.

9. The method according to claim 1, further comprising a step of writing to memory either the non-inverted code word v1 or said new code word v2, and a step of reading a code word stored in the memory according to the steps of claim 1.

10. A device for selectively inverting a word to be written to a memory, the memory comprising memory cells, each memory cell allowing at least two values associated with at least one bit to be stored, the device comprising means allowing the steps of the method for selectively inverting according to claim 1 to be implemented.

11. The device according to claim 10, further comprising means for writing an inverted word or non-inverted word to the memory.

12. The device according to claim 10, further comprising means for reading a word stored in the memory and for determining whether the stored word is inverted or not.

13. The device according to claim 10, wherein the memory consists of a plurality of single-level memory cells containing a single information bit that may take two possible electrical states, or consists of a plurality of multi-level memory cells capable of storing more than one information bit and of taking more than two electrical states.

14. The device according to claim 10, wherein the means comprise an error-correcting code that has one or more of the features of being linear, binary, of block and/or systematic type.

15. A non-transitory computer-readable medium comprising instructions executable by at least one processor to perform the method according to claim 1.

* * * * *